(12) United States Patent  
Nygaard (10) Patent No.: US 9,496,270 B2  
(45) Date of Patent: Nov. 15, 2016

(54) HIGH DENSITY SINGLE-TRANSISTOR ANTIFUSE MEMORY CELL

(71) Applicant: QUALCOMM Incorporated, San Diego, CA (US)

(72) Inventor: Paul A. Nygaard, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 16 days.

(21) Appl. No.: 14/292,395

(22) Filed: May 30, 2014

(65) Prior Publication Data

US 2015/0348979 A1    Dec. 3, 2015

(51) Int. Cl.
| | |
|---|---|
| H01L 23/525 | (2006.01) |
| H01L 27/112 | (2006.01) |
| H01L 21/8234 | (2006.01) |
| G11C 17/16 | (2006.01) |
| H01L 21/84 | (2006.01) |
| H01L 27/12 | (2006.01) |
| H01L 29/861 | (2006.01) |

(52) U.S. Cl.
CPC ......... *H01L 27/11206* (2013.01); *G11C 17/16* (2013.01); *H01L 21/84* (2013.01); *H01L 27/1203* (2013.01); *H01L 23/5252* (2013.01); *H01L 29/8611* (2013.01); *H01L 2924/0002* (2013.01)

(58) Field of Classification Search
CPC . G11C 16/225; G11C 16/34; G11C 16/3459; G11C 16/3468; G11C 16/3486; G11C 17/165; G11C 17/16; G11C 2229/763; H01L 27/11206; H01L 27/112; H01L 21/84; H01L 27/1203; H01L 29/8611; H01L 23/5252; H01L 21/823418; H01L 21/823425; H01L 21/823814; H01L 27/11226; H01L 27/11266; H01L 29/7833; H01L 29/0843; H01L 29/0873; H01L 29/66659; H01L 29/7835; H01L 29/78624; H01L 29/78639

See application file for complete search history.

(56) References Cited

U.S. PATENT DOCUMENTS

| | | | |
|---|---|---|---|
| 4,876,220 A | 10/1989 | Mohsen et al. | |
| 5,432,106 A | * 7/1995 | Hong | 438/257 |
| 6,096,580 A | * 8/2000 | Iyer et al. | 438/132 |
| 6,215,140 B1 | 4/2001 | Reisinger et al. | |

(Continued)

OTHER PUBLICATIONS

Choi et al., Antifuse EPROM circuit for Field Programmable DRAM, Solid-State Circuit Conference, ISSCC, IEEE International, Feb. 2000, pp. 406-407.

(Continued)

*Primary Examiner* — Jarrett Stark  
*Assistant Examiner* — Bitew Dinke  
(74) *Attorney, Agent, or Firm* — Haynes and Boone, LLP (57) ABSTRACT

Various methods and devices that involve single transistor diode connected anti-fuse memory cells are disclosed. An exemplary memory cell comprises a thin gate insulator. The memory cell also comprises a bulk region of a first conductivity type in contact with a first side of the thin gate insulator. The memory cell also comprises a polysilicon gate electrode of the first conductivity type in contact with a second side of the thin gate insulator. The memory cell also comprises a source region of a second conductivity type in contact with the bulk region at a junction. The polysilicon gate electrode and the source region are operatively coupled to a programming voltage source that addresses the memory cell by blowing the thin gate insulator. The junction forms a diode for the memory cell. The bulk region can be in an active layer of a semiconductor on insulator structure.

17 Claims, 4 Drawing Sheets

(56) References Cited

U.S. PATENT DOCUMENTS

| | | |
|---|---|---|
| 6,421,293 B1 | 7/2002 | Candelier et al. |
| 6,441,676 B1* | 8/2002 | Koehl et al. ................. 327/525 |
| 6,515,931 B2 | 2/2003 | Marr et al. |
| 6,549,458 B1* | 4/2003 | Rao et al. ................ 365/185.08 |
| 6,593,217 B1* | 7/2003 | Fujisawa ........... H01L 21/28518 |
| | | 257/E21.165 |
| 6,777,757 B2 | 8/2004 | Peng et al. |
| 6,856,540 B2 | 2/2005 | Peng et al. |
| 6,898,116 B2 | 5/2005 | Peng |
| 6,936,909 B2 | 8/2005 | Marr et al. |
| 6,940,751 B2 | 9/2005 | Peng et al. |
| 6,992,925 B2 | 1/2006 | Peng |
| 7,046,569 B2 | 5/2006 | Ito et al. |
| 7,053,452 B2 | 5/2006 | Sang |
| 7,071,534 B2 | 7/2006 | Marr et al. |
| 7,101,738 B2 | 9/2006 | Marr et al. |
| 7,102,951 B2 | 9/2006 | Paillet et al. |
| 7,110,278 B2 | 9/2006 | Keshavarzi et al. |
| 7,167,402 B2 | 1/2007 | Yaoi et al. |
| 7,180,361 B2 | 2/2007 | Takai |
| 7,321,502 B2 | 1/2008 | Paillet et al. |
| 7,329,565 B2 | 2/2008 | Herner |
| 7,405,463 B2 | 7/2008 | Marr et al. |
| 7,411,810 B2 | 8/2008 | Kim |
| 7,471,540 B2 | 12/2008 | Luan et al. |
| 7,638,855 B2 | 12/2009 | Lung |
| 7,655,509 B2 | 2/2010 | Herner |
| 7,741,697 B2 | 6/2010 | Chen |
| 7,795,094 B2 | 9/2010 | Kreipl |
| 7,834,417 B2 | 11/2010 | Min et al. |
| 7,956,397 B2 | 6/2011 | Wada et al. |
| 8,035,191 B2 | 10/2011 | Lin et al. |
| 8,159,895 B2 | 4/2012 | Schmitt |
| 8,193,900 B2 | 6/2012 | Fan et al. |
| 8,208,312 B1 | 6/2012 | Novosel et al. |
| 8,283,731 B2 | 10/2012 | Luan |
| 8,313,999 B2 | 11/2012 | Cappellani et al. |
| 8,330,189 B2 | 12/2012 | Luan et al. |
| 8,513,770 B2* | 8/2013 | Shin et al. .................... 257/530 |
| 8,514,606 B2 | 8/2013 | Chung |
| 8,575,719 B2 | 11/2013 | Johnson et al. |
| 8,618,613 B2 | 12/2013 | Tong et al. |
| 8,760,904 B2 | 6/2014 | Chung |
| 8,942,023 B2 | 1/2015 | Tsuda et al. |
| 8,975,724 B2 | 3/2015 | Park et al. |
| 2001/0022746 A1* | 9/2001 | Kim et al. ..................... 365/200 |
| 2001/0026494 A1* | 10/2001 | Marr et al. ................ 365/225.7 |
| 2003/0227056 A1* | 12/2003 | Wang ..................... H01L 21/84 |
| | | 257/347 |
| 2005/0002244 A1* | 1/2005 | Yaoi et al. ..................... 365/200 |
| 2005/0029598 A1* | 2/2005 | Marr et al. ..................... 257/355 |
| 2005/0029622 A1* | 2/2005 | Marr et al. ..................... 257/530 |
| 2005/0051848 A1* | 3/2005 | Ker ................. H01L 21/823814 |
| | | 257/356 |
| 2005/0280065 A1* | 12/2005 | Iwata ................. G11C 16/0475 |
| | | 257/310 |
| 2006/0033162 A1* | 2/2006 | Sang ............................ 257/355 |
| 2006/0097345 A1* | 5/2006 | Marr ............................ 257/530 |
| 2006/0148228 A1* | 7/2006 | Bang ................ H01L 21/28518 |
| | | 438/592 |
| 2006/0258104 A1* | 11/2006 | Ono ............................ 438/266 |
| 2006/0292754 A1* | 12/2006 | Min .................... H01L 23/5252 |
| | | 438/131 |
| 2008/0175060 A1* | 7/2008 | Liu et al. ................. 365/185.18 |
| 2008/0217686 A1* | 9/2008 | Majumdar .......... H01L 29/7848 |
| | | 257/347 |
| 2008/0237673 A1* | 10/2008 | Wada et al. .................... 257/299 |
| 2008/0258217 A1 | 10/2008 | Chen |
| 2008/0272402 A1* | 11/2008 | Saha et al. ..................... 257/256 |
| 2010/0008139 A1* | 1/2010 | Bae .......................... 365/185.03 |
| 2010/0110750 A1* | 5/2010 | Namekawa ..................... 365/96 |
| 2011/0101496 A1* | 5/2011 | Park et al. ..................... 257/530 |
| 2011/0298054 A1* | 12/2011 | Luan ............................ 257/369 |
| 2012/0039107 A1 | 2/2012 | Chung |
| 2012/0044740 A1 | 2/2012 | Chung |
| 2012/0091557 A1 | 4/2012 | Lee |
| 2012/0104544 A1* | 5/2012 | Kubota ........................ 257/530 |
| 2012/0314475 A1* | 12/2012 | Li ................................ 365/104 |
| 2012/0327700 A1* | 12/2012 | Li ................................ 365/104 |
| 2013/0033921 A1* | 2/2013 | Tsuda et al. ................... 365/148 |
| 2013/0051113 A1 | 2/2013 | Kwon |
| 2013/0063202 A1* | 3/2013 | Li et al. ......................... 327/525 |
| 2014/0138777 A1* | 5/2014 | Wang ............................ 257/379 |
| 2014/0183689 A1* | 7/2014 | Sung ............................ 257/530 |
| 2014/0217484 A1* | 8/2014 | Luan ................. H01L 21/28008 |
| | | 257/288 |

OTHER PUBLICATIONS

Crowley et al., 512Mb PROM with 8 Layers of Antifuse/Diode Cells, Solid-State Circuits Conference, ISSCC, IEEE International, Feb. 2003, vol. 1, pp. 284-293.

Ebrad et al., Review of fuse and antifuse solutions for advanced standard CMOS technologies, Microelectronics Journal, Dec. 2009, vol. 40, pp. 1755-1765.

Matsufuji et al., Toshiba Corporation Center for Semiconductor Research and Development, A 65nm Pure CMOS On-time Programmable Memory Using a Two-Port Antifuse Cell Implemented in a Matrix Structure, IEEE Asian Solid-State Circuits Conference, Jeju, Korea, Nov. 12-14, 2007, pp. 212-215.

Ng et al., Diode Based Gate Oxide Anti-fuse One Time Programmable Memory Array in Standard CMOS Process, Electron Devices and Solid-State Circuits, IEEE International, Dec. 2009, pp. 457-460.

* cited by examiner

HIGH DENSITY SINGLE-TRANSISTOR ANTIFUSE MEMORY CELL

BACKGROUND OF THE INVENTION

Non-volatile memory (NVM) allows an electronic device to retain information when power is removed from the device. The most common examples of NVM are: magnetic storage devices, such as hard disc drives which store data in the form of different patterns of magnetization; hard-wired read-only memory (ROM), such as circuit configurations that store information based on their physical configuration; and one time programmable (OTP) memory, which stores information in the form of an altered physical characteristic of a memory cell. OTP memory is sometimes considered a subset of ROM in that once it is programmed, it can only be read, and cannot be rewritten. OTP memories can include fuse or antifuse memory cells.

Fuse and antifuse OTP memory cells are distinguishable in terms of how the physical state of the memory cell changes when the cell is programmed. Fuse memory initially presents a low resistance path and is programmed by permanently breaking that low resistance path. An example of a fuse memory is a thin strip of metallization between two circuit nodes that is programmed by exposing the strip to a laser that severs the conductive path between those two nodes. Antifuse memory cells start with a high resistance state between two circuit nodes, and are programmed by permanently creating a low resistance circuit branch between the nodes. An example of an antifuse memory cell is a capacitor between two circuit nodes that can be blown through the application of a programming voltage.

Figure 1:
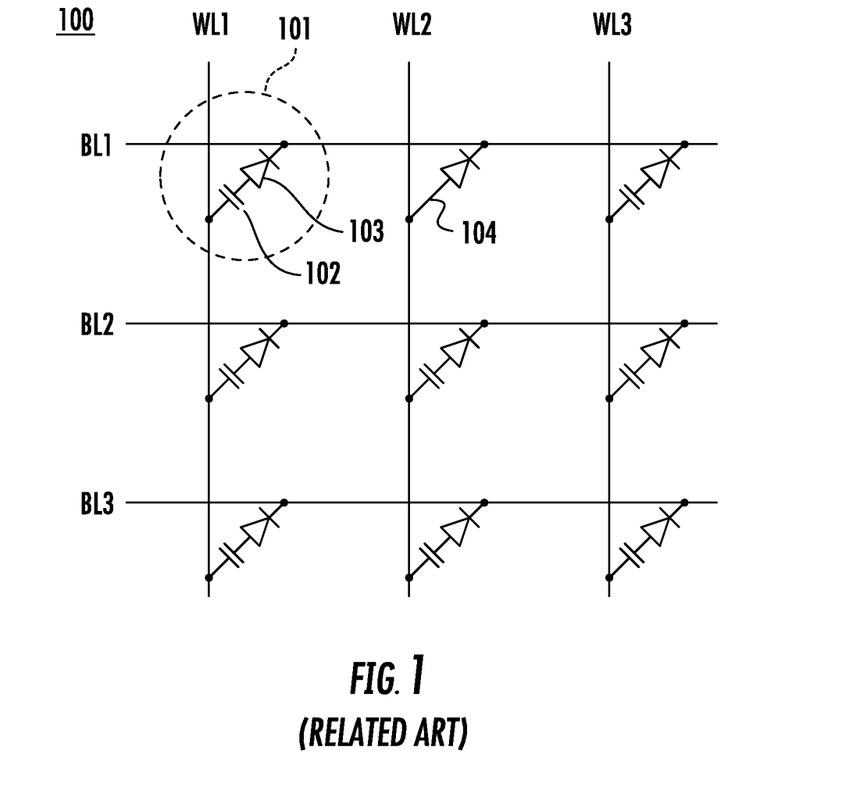
FIG. 1 illustrates an anti-fuse memory cell located at the cross point of a nonvolatile memory that is in accordance with the related art.

Memory array 100 in FIG. 1 illustrates a set of OTP memory cells 101. Each memory cell 101 includes a capacitor 102 and a diode 103. Memory array 100 includes three word lines: WL1, WL2, and WL3. The word lines are connected to a number of capacitor plates set by the number of word lines. Since memory array 100 includes three bit lines: BL1, BL2, and BL3, each word line is connected to three capacitor plates. Capacitor 102 is the antifuse element of memory cell 101. Conductive path 104 represents a capacitor that has been programmed by blowing the associated capacitor. Since the memory cells link a bit line and a word line in the memory, each cell can be described as being located at a cross point of the memory array. Programming is conducted by altering the voltages on a word line and a bit line to break the capacitor of the memory cell that links that particular word line and bit line. Diode 103 is necessary for isolating inactive word lines when a memory cell on a different word line is read. Note that although memory array 100 is illustrated as having multiple word lines and multiple bit lines, a memory array may only have a single word line.

OTP memories can be used to program in any kind of information that distinguishes a single electronic device from other similar devices. For example, OTP memories are used to program electronic devices with information regarding the particular device such as a lot number or serial number of the device. OTP memories can also be used to enter codes into trimming circuits that counteract manufacturing variations that may have been introduced to a particular device.

SUMMARY OF INVENTION

In one embodiment, a memory cell is provided. The memory cell comprises a thin gate insulator. The memory cell also comprises a bulk region of a first conductivity type in contact with a first side of the thin gate insulator. The memory cell also comprises a polysilicon gate electrode of the first conductivity type in contact with a second side of the thin gate insulator. The memory cell also comprises a source region of a second conductivity type in contact with the bulk region at a junction. The polysilicon gate electrode and the source region are operatively coupled to a programming voltage source that addresses the memory cell by blowing the thin gate insulator. The junction forms a diode for the memory cell.

In another embodiment, a memory cell is provided. The memory cell comprises a thin gate insulator. The memory cell also comprises a bulk region in an active layer of a semiconductor on insulator wafer. The bulk region contacts a first side of the thin gate insulator. The memory cell also comprises a gate electrode that contacts a second side of the thin gate insulator. The memory cell also comprises a source region in the active layer of the semiconductor on insulator wafer. The source region contacts the bulk region at a junction. The gate electrode and the source region are operatively coupled to a programming voltage source that addresses the memory cell by blowing the thin gate insulator. The junction forms a diode for the memory cell.

In another embodiment, an apparatus is provided. The apparatus comprises an active layer having a first region located between one side of a thin gate insulator and a buried insulator of a semiconductor on insulator wafer. The apparatus also comprises a gate electrode in contact with a second side of the thin gate insulator. The apparatus also comprises a contact coupled to the active layer. The apparatus also comprises a program control line that causes a programming voltage to be applied to the gate electrode and the contact. The thin gate insulator breaks to form a current branch from the gate electrode through the first region to the contact when the programming voltage is applied. The junction on the current branch forms a diode

DETAILED DESCRIPTION OF THE EMBODIMENTS

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers all such modifications and variations within the scope of the appended claims and their equivalents.

Figure 2:
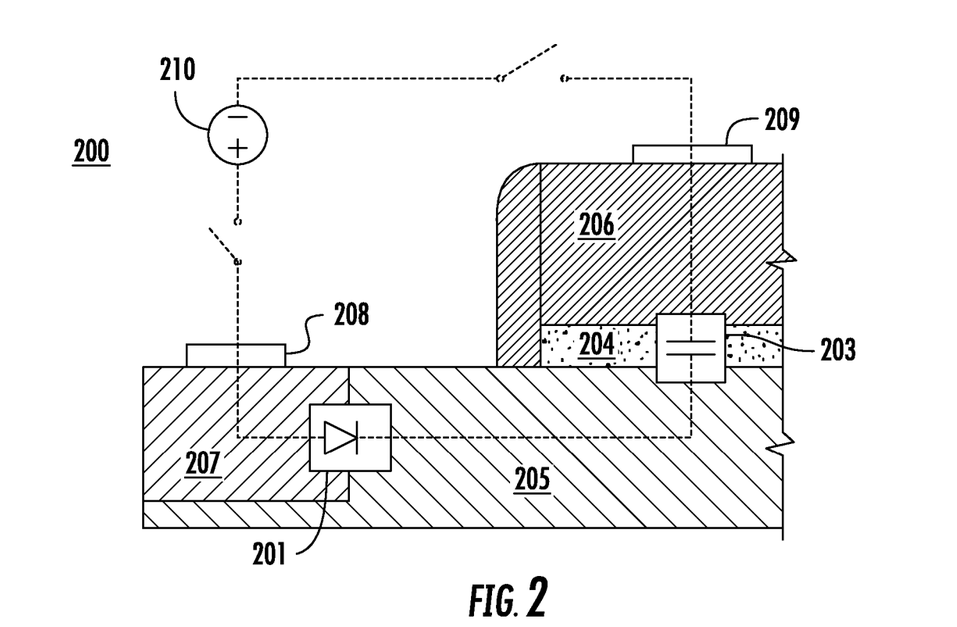
FIG. 2 illustrates a cross section and schematic overlay of a single transistor memory cell that is in accordance with embodiments of the present invention.

An anti-fuse memory cell can be formed using a single transistor. Semiconductor structure 200 in FIG. 2 illustrates diode 201 and capacitor 203 that can serve as capacitor 102 and diode 103 in memory array 100 of FIG. 1. The dielectric of capacitor 203 is thin gate insulator 204. Thin gate insulator 204 is in contact with bulk region 205 along a first side and gate electrode 206 along a second side. Thin gate insulator 204 can be silicon dioxide. Gate electrode 206 can be polysilicon. A source region 207 is in contact with bulk region 205. In specific approaches, source region 207 can be formed in the bulk region through a chemical diffusion or ion implantation step used to dope the bulk region. Contact 208 provides an electrical contact to source region 207. Contact 209 provides an electrical contact to gate electrode 206. Although the contacts are drawn as being in the plane of this cross section, they can be outside of the illustrated cross section such that a signal would need to travel through the plane of the page to reach either contact. However, certain benefits accrue to approaches in which the contacts are provided in proximity to the plane defined by the cross section illustrated in FIG. 2 as described below with reference to the plan view in FIG. 3.

Semiconductor structure 200 forms a memory cell using a single transistor. The memory cell can be located at a cross point in a memory array. For example, source contact 208 can be connected to a bit line of the memory array, and gate contact 209 can be connected to a word line of a memory array. Depending upon the polarity of diode 201, the connection of these contacts to the memory array may need to be reversed. Diode 201 prevents current from flowing through the memory cell when a second memory cell in the memory array is accessed. The memory cell can be programmed by applying a programming voltage to gate electrode 206 and source region 207 from a programming voltage source 210.

The programming voltage source can be provided via a system that is built on the same substrate as the memory cell, or it can be provided from an external system. The voltage can be provided from an external battery or other voltage supply, and can be regulated by a linear or switched power regulator. The programming voltage needs to be sufficiently high to blow the thin gate insulator 204 to create a short from gate electrode 206 to bulk region 205. As such, the programming voltage may be higher than another standard voltage that is more widely used in the system to which the memory cell is a part. The programming voltage source can include a charge pump to boost the standard voltage up to a boosted level in order to generate the programming voltage.

The programming voltage, surface area of the gate insulator, thickness of the gate insulator, and material used for the thin gate insulator can all be selected to maximize the reliability of the memory cell. The reliability of the memory cell is increased by assuring that the gate reliably blows when the programming voltage is applied, does not blow until the programming voltage is applied, and does not interfere with a reliable current flow from gate electrode 206 to bulk region 205 after the device is programmed. In particular approaches, the gate insulator will be a layer of silicon dioxide that is less than 50 angstroms thick. In particular approaches, the programming voltage will exceed 10 volts. The gate insulator can also be silicon nitride, oxynitride, hafnium oxide, or other high-K dielectrics.

The diode can be formed by a junction of source region 207 and bulk region 205. For example, source region 207 could be a semiconductor doped with a first dopant causing it to have a first conductivity type, while bulk region 205 could be a semiconductor doped with a second dopant causing it to have a second conductivity type. Source region 207 could comprise heavily p-type doped silicon (P+) and bulk region 205 could comprise lightly n-type doped silicon (N−). In keeping with this example, gate electrode 206 could be n-type doped polysilicon. In this situation, the junction that will form the diode is the junction between source region 207 and bulk region 205. The resulting diode will be a P+/N− diode. The same result could be achieved if the conductivity types of each of the three regions was reversed such that the resulting diode was an N+/P− diode. In an alternative approach, the bulk region could be doped with a different conductivity type than the gate electrode. However, as described below with reference to FIG. 4, the resulting memory cell might not function as well under this approach.

The source-bulk junction of a single transistor antifuse memory cell can be spaced apart from the gate insulator of the transistor. As shown in FIG. 2, the source-bulk junction in semiconductor structure 200 is outside the lateral scope of gate insulator 204 by a substantial margin. The fabrication of any device on the scale of microns requires delicate precision and is usually highly dependent on manufacturing line variations. When the fabrication process includes the purposeful destruction of circuit elements, these manufacturing intolerances need to be managed with an even greater level of care. Breaking gate insulator 204 introduces the potential for damage to other regions of semiconductor structure 200. In particular, regions of the structure that are in close proximity to the gate are at risk of being damaged and not functioning as expected. Diode 201 is therefore spaced apart from the gate insulator to assure that it still functions as required once the gate insulator is destroyed. As diode 201 is specifically meant for situations in which the gate has been destroyed, care should be taken to avoid the risk of it being damaged when the memory cell is programmed.

While the gate and diode spacing can be increased to assure reliability of the memory cell, too much spacing is not desirable as it causes a commensurate decrease in the density of the memory cell. Therefore, it is beneficial to determine a minimum distance that will provide for a required degree of reliability, and to not exceed that minimum distance when implementing the memory cell. The minimum distance of the junction from the gate insulator depends on the programming voltage, the material used for the gate insulator, the material used for source region 207, and the material used for bulk region 205. However, in most applications, the junction will be protected from damage if it is spaced at least 0.3 microns from the thin gate oxide. In situations where the programming voltage is less than 9 volts, the gate insulator is 40 angstroms thick silicon dioxide, and the bulk region is lightly doped silicon; the minimum spacing should be at least 0.5 microns.

Figure 3:
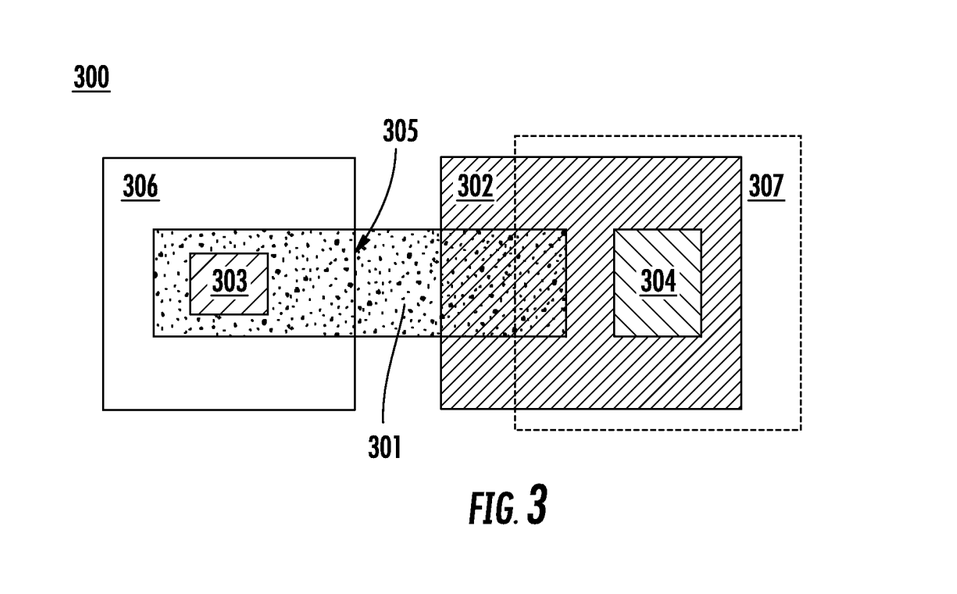
FIG. 3 illustrates a single transistor memory cell plan view that is in accordance with embodiments of the present invention.

FIG. 3 illustrates a plan view 300 of semiconductor structure 200. Plan view 300 illustrates diffusion region 301 which is formed in a semiconductor substrate and will serve as a portion of the conductive path for the memory cell. Plan view 300 additionally shows gate electrode 302, source contact 303, and gate contact 304. Depending upon which kind of junction will serve as the diode of the memory cell, additional masking steps may introduce dopants to alter the conductivity types of the various regions of material. As drawn, two additional masking steps introduce a dopant in region 306 to create a P+ doped source region and a second dopant in region 307 to create an N+ doped gate electrode. Note that these doping steps are not in keeping with traditional self-aligned transistor processing due to the fact that the illustrated structure has a source region that is spaced apart from the gate in order to protect the diode formed by the source-drain junction. However, in situations where the junction is not spaced apart, the source doping can be conducted using a traditional self-aligned process.

The small footprint of the memory cell illustrated by plan view 300 allows for a dense memory array. As mentioned previously, placing source contact 303 and gate contact 304 in line with the middle of the diffusion region 301 beneficially minimizes the density of the memory cell, as the main component of the y-axis spacing for the resulting layout is set by the minimum spacing requirements of the associated material regions. The main component of the x-axis spacing of plan view 300 is set by the minimum requirements for a reliable gate insulator, and the protective spacing set between the source-bulk junction 305 and the gate insulator. In situations where the junction is not spaced apart, the cell reduces to nearly half the size of the minimum size transistor that a process allows for. The reason the cell reduces to half the size of the minimum transistor is that diffusion 301 does not have to provide for a drain region. As a result, diffusion region 301 is physically remote from all regions of the substrate that have the same conductivity as region 306, besides region 306 itself.

Since the transistor of the memory cell is not meant to conduct current between a source and drain, the entire drain region is superfluous, and does not need to be included. This is particularly illustrated in FIG. 3, in which diffusion region 301 is not in contact with a drain region. Indeed, plan view 300 does not include a drain region to the right of gate electrode 302, not because it was omitted, but because there is no drain region in the device. In this sense, the source region of the transistor is referred to as a source because it is located where the source region of a regular transistor would usually be, and not because of how that region of the device behaves. Depending upon the relative conductivity of the bulk and source regions, and the configuration of the memory array, electrons could flow into or out of contact 303 such that the source region can behave as either a "drain" or a "source" as those terms are used in reference to the operational characteristics of a transistor in a circuit schematic. In other words, the term is used here to refer to the usual physical configuration of a transistor source in the abstract, and is not meant to describe the operation of the device from a schematic perspective.

The minimum spacing of the diode and gate insulator affects the performance of the memory cell in another manner that has not yet been described. Breaking gate insulator 204 does not, by itself, create a clean conductive path from gate electrode 206 to source region 207. In a standard configuration, the top surface of bulk region 205 needs to be inverted under gate 204 in order to form a channel through which charge carriers can traverse the bulk region between the source and drain. This is because a standard transistor comprises two junctions—one between the source and bulk, and one between the drain and bulk. In situations in which bulk region 205 is a semiconductor material having a first conductivity type, and gate electrode 206 has a second conductivity type, or is a metal or metal silicide, blowing the gate insulator will create a junction in the bulk region located in close proximity to the damaged portion of the gate insulator. This junction could effectively act as a drain-bulk junction and inhibit the flow of charge carriers between the source region and gate electrode. The characteristics of this junction are difficult to characterize because gate insulator 204 is not damaged in a consistent and repeatable manner. However, it suffices to note that the conductive path from the source region to the gate electrode in these situations is somewhat unreliable and increasing the length of the "channel" between the source to bulk junction and the effective "drain" to bulk junction can enhance this unpredictability. Therefore, if certain materials are used for the gate electrode and bulk region, increasing the spacing of the diode and gate insulator can decrease the reliability of the memory cell. This is problematic given that increasing the spacing of the diode junction and gate insulator increased the reliability of the memory cell through the alternative affect described above—regarding the potential for damage to the diode when the gate is blown.

Figure 4:
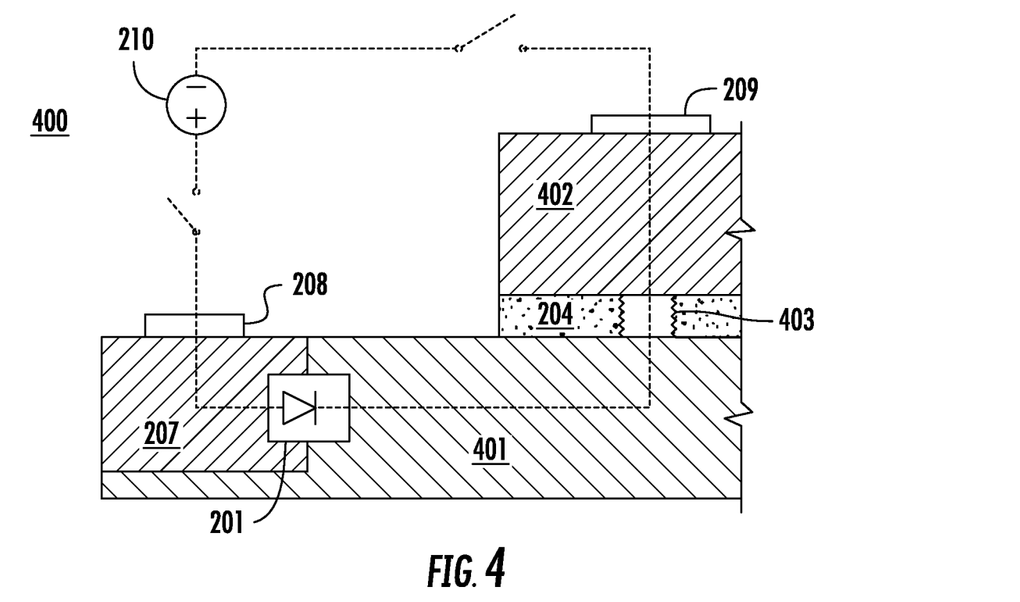
FIG. 4 illustrates another cross section and schematic overlay of a single transistor memory cell that is in accordance with embodiments of the present invention.

Semiconductor structure 400 in FIG. 4 is similar to semiconductor structure 200 in FIG. 2 except that bulk region 401 and gate electrode 402 are semiconductor materials that have the same conductivity type. For example, bulk region 401 could be lightly doped n-type material and gate electrode 402 could be heavily doped n-type material. When gate electrode 204 is blown, a conductive path will be formed all the way from gate contact 209 to the P+/N− source-bulk junction. Since the conductivity of the gate electrode and bulk region are the same, there are no energy barriers formed along this conductive path. The same result could be achieved if the conductivity types of each of the three regions were reversed such that the resulting diode was a N+/P− diode. In either case, when gate insulator 204 is blown, conductive path 403 through gate insulator 204 forms part of a more reliable conductive path from gate electrode 402 all the way to source region 207. Therefore, this approach effectively decouples the spacing of the junction from the reliability of the conductive—programmed—state of the memory cell, and the junction spacing can be set with only the density of the memory cell and protection of the diode taken into consideration.

Figure 5:
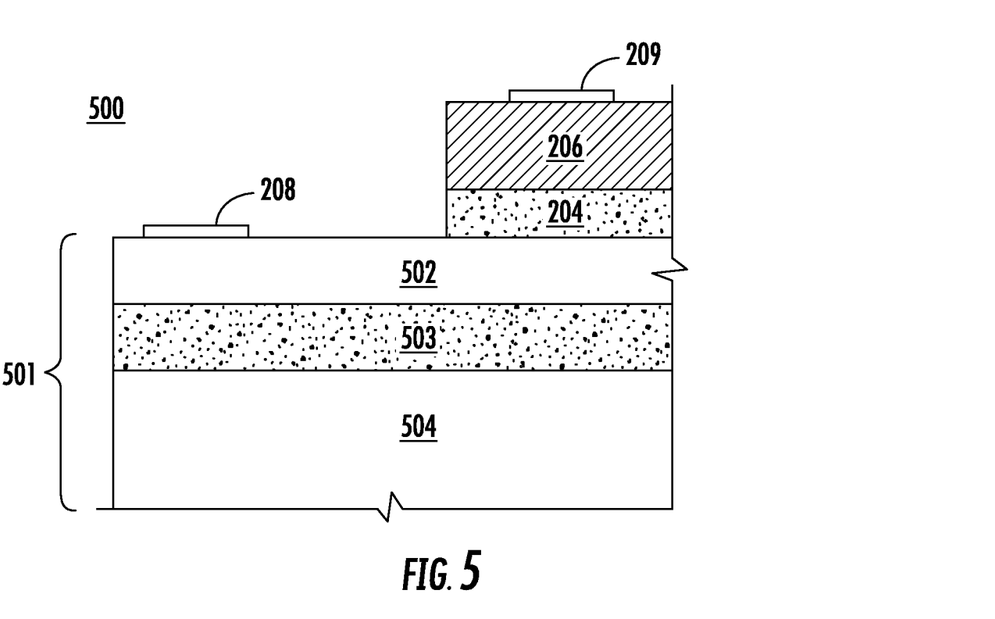
FIG. 5 illustrates a cross section of a single transistor memory cell on a semiconductor on insulator wafer that is in accordance with embodiments of the present invention.

Another way in which the density of the memory cell can be increased is by implementing the cell on a semiconductor on insulator (SOI) wafer. FIG. 5 displays semiconductor structure 500 which includes a portion of an SOI wafer 501 having an active layer 502, a buried insulator layer 503, and a substrate layer 504. The source and bulk regions of the memory cell are formed in active layer 502. The particular implementation of the memory cell on an SOI wafer provides a significant benefit in that the source and bulk regions do not need to be placed in well regions on the device. In a conventional bulk semiconductor, a well region could be required to form the source and bulk regions. Wells introduce additional spacing requirements in semiconductor process rules. As a result, plan view 300 would include either a well surrounding the entire layout, or at least half of the device. In either situation, the overall area consumption of the device would increase, and, furthermore, the footprint of the memory cell might be altered such that it could not be placed in an array in as efficient a manner as is allowed by the uniform rectangle illustrated by plan view 300.

Depending upon the materials selected for the gate electrode, bulk region, and source region, a number of different diodes can be formed to serve as the diode for the memory cell once the cell has been programmed. A few examples have already been provided. The diode can be a P/N diode of any combination of strongly doped or weakly doped material that is formed at the source-bulk junction. The diode can also be a P/N diode of any combination of strongly doped or weakly doped material that is formed at the gate-bulk junction. In addition, the diode can also be a Shottky metal/N or metal/P diode where the semiconductor can be strongly doped or weakly doped material formed at the gate-bulk junction. The metal can be a pure elemental metal or a metal alloy, such as a silicide. In approaches where the diode is formed by a gate-bulk junction, and the memory cell is formed on an SOI device, the source region may not be necessary at all, and access to the bulk region may be provided by a direct metal contact through a silicided surface of the bulk region. A combined SOI device, gate-bulk junction, and Shottky approach would exhibit the benefit of not requiring any dopant masking patterns for the memory cell.

In a specific approach, the gate electrode can be undoped silicided polysilicon on a bulk region of weakly doped n-type or p-type material such that the resulting diode is a Schottky silicide/N- or silicide/P-diode. Referring back to FIG. 3, this specific approach has the potential to exhibit a high density because the portion of gate electrode 302 that extends to the left of the second dopant region 307 could be eliminated. The reason this portion can be eliminated is described below with reference to FIG. 7. As an added benefit to this approach, processing steps are simplified because there is no need to control for alignment of the mask used to dope region 306 and the separate mask used to dope region 307.

Figure 6:
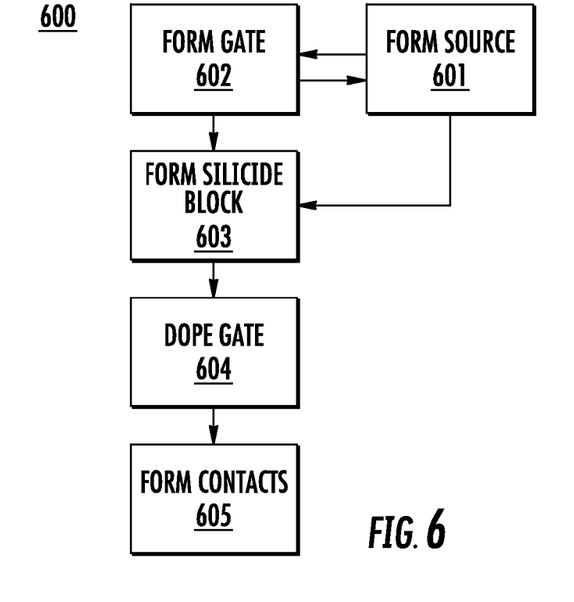
FIG. 6 illustrates flow chart of a method of fabricating a single transistor memory cell that is in accordance with embodiments of the present invention.

A method 600 for producing a high density single transistor antifuse memory cell is illustrated in FIG. 6. Method 600 can begin with step 601 in which a source region of the memory cell is formed in a bulk region on a semiconductor substrate. The bulk region can be in a well formed on a substrate, can be part of the substrate itself, can be formed in the substrate, or can be formed in the active layer of an SOI substrate. Method 600 could alternatively being with step 602 in which the gate of a transistor is formed. The gate will include a thin gate oxide and a gate electrode. The gate electrode may be polysilicon. The gate can be formed through a patterned etch to create a raised plateau of conductive material above an insulator. The bulk region can comprise material of a first conductivity type such as N− semiconductor material. The source region can comprise material of a second conductivity type such as P+ semiconductor material. The reason the two steps are interchangeable is that the source may be formed after the gate has been formed or before. In either case, the source can be formed using a doping process that uses its own mask to define the source region doping. However, in situations where the gate is formed first, the source can also be formed using the gate structure as a mask for the source implant. In that case, steps 601 and 602 might also include the formation of a spacer on the side of the gate to assure that the source-bulk junction is spaced apart from the gate insulator.

Method 600 can proceed with the optional formation of a masking layer in step 603. The masking layer can be a silicide block layer. The masking layer can cover a portion of the gate electrode on the side facing the source region. The masking layer can cover the source-bulk junction and can also provide a continuous cover for the memory cell from the source-bulk junction, up the side of the gate plateau, and over the covered portion of the gate electrode. The masking layer can be formed through a blanket deposition followed by an etch to expose a separate portion of the gate and source region. The etch of the silicide block may be conducted in two parts with the first step exposing the portion of the gate electrode that is not covered in a final structure in step 603, and a second step exposing the source region after step 604.

Method 600 can proceed with the optional doping of the gate electrode in step 604. In specific approaches described above, the gate electrode is doped to match the conductivity of the bulk region, or is doped to form a particularized junction with the bulk region. This step can be conducted in combination with the creation of a silicide block layer in step 603. In addition, in situations in which the source region is also doped, this step can be conducted in accordance with processing requirements for the alignment of separate dopants.

Method 600 proceeds with step 605 in which contacts are formed to the source region and gate region of the memory cell. In specific approaches, the contact will be formed through exposure of the surface of the gate electrode and source region and the introduction of a silicide step using the silicide block layer formed in step 603. In other approaches, a masking layer can be used to introduce silicide to the surface of the gate electrode and the source region. In devices in which a separate source region is not formed, the same mask or silicide block layer can be used to introduce silicide to the surface of the active region. The silicidation of the semiconductor regions can be accompanied by the formation of vias that can be contacted to metallization layers for the routing of sensing and programming circuitry. In particular, the contacts can be operatively coupled to a programming voltage source for blowing the gate insulator of the memory cell to program the cell.

Figure 7:
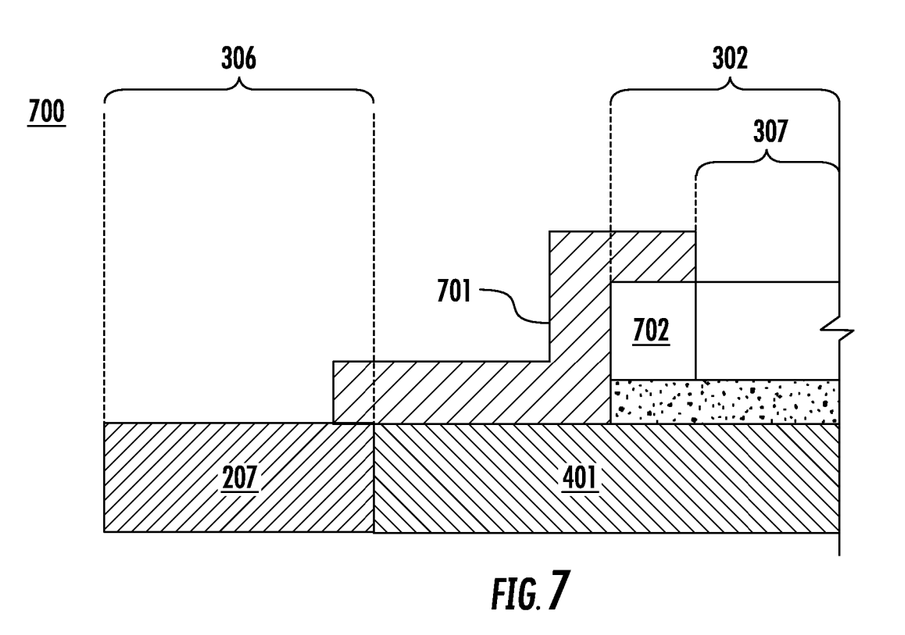
FIG. 7 illustrates a cross section of a single transistor memory cell having a silicide block layer that is in accordance with embodiments of the present invention.

FIG. 7 illustrates semiconductor structure 700 that includes the masking layer 701 formed in step 603. Masking layer 701 covers a region of undoped polysilicon 702 in the gate electrode. Masking layer 701 likewise covers, and is in contact with, the junction between source region 207 and bulk region 401. Masking layer 701 serves to prevent the dopant used for the gate electrode from entering the bulk region or affecting the diode junction. As such, it is put in place before the gate electrode is doped, which is why undoped polysilicon region 702 is distinguishable from the remainder of the gate electrode. Masking layer 701 also serves as a silicide block for when the source region and gate electrode are exposed to a silicidation process for forming their respective contacts. As mentioned previously, in situations where the gate electrode is not doped, second doping region 307 does not exist, the commensurate risk of introducing unwanted dopants to the bulk region does not exist either, and the buffer between the lateral extent of gate electrode 302 and second doping region 307 can be eliminated to further increase the density of the memory cell.

Although some embodiments in the above disclosure were directed to situations in which the gate electrode of the device overlies a region that was referred to as the bulk region, this term is not meant to exclude well regions formed in a substrate as the term bulk region is meant to encompass its broadest meaning as used by those of ordinary skill in the art. Furthermore, although the memory cell was referred to as being in a memory array, a memory array can include a single dimension, and the memory cells disclosed herein can be used in isolation to store a single bit of information. Furthermore, the approaches discussed above can be used anywhere nonvolatile device with a programmed and unprogrammed state are required, and are not limited to memories. Furthermore, although silicon was used as the exemplary semiconductor material in many of the examples provided above, and semiconductor material could be used in its place including compound semiconductors such as gallium arsenide, aluminum nitride, and indium phosphide.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:

1. A memory cell comprising:
a thin gate insulator;
a bulk region of a first conductivity type in contact with a first side of the thin gate insulator;
a polysilicon gate electrode of the first conductivity type in contact with a second side of the thin gate insulator; and
a source region of a second conductivity type in contact with the bulk region at a junction, wherein the second conductivity type is different from the first conductivity type, further wherein the junction forms a diode for the memory cell and the junction is laterally spaced from the thin gate insulator and does not directly underlie the thin gate insulator;
wherein the bulk region is in an active layer of a semiconductor-on-insulator structure comprising a buried insulator and a substrate layer; and
wherein the thin gate insulator is blown upon application of a programming voltage addressed to the memory cell across the polysilicon gate electrode and the source region.

2. The memory cell of claim 1, wherein:
the thin gate insulator is less than 50 angstroms thick;
the programming voltage to blow the thin gate insulator exceeds 10 volts; and
the source region is located in the active layer of the semiconductor-on-insulator structure.

3. The memory cell of claim 1, wherein:
the junction is at least 0.3 microns from the thin gate insulator.

4. The memory cell of claim 1, further comprising:
a layer of polysilicon comprising the polysilicon gate electrode of the first conductivity type and a region of undoped polysilicon;
wherein the region of undoped polysilicon is in contact with the second side of the thin gate insulator and a masking layer; and
wherein the junction is also in contact with the masking layer.

5. The memory cell of claim 1, wherein:
the bulk region is physically remote from every region of the second conductivity type in the semiconductor-on-insulator structure besides the source region.

6. The memory cell of claim 1, wherein the junction is laterally spaced from the thin gate insulator by at least 0.3 micrometers.

7. The memory cell of claim 1, wherein the junction is laterally spaced from the thin gate insulator by at least 0.5 micrometers.

8. A memory cell comprising:
a thin gate insulator;
a bulk region in an active layer of a semiconductor on insulator wafer, wherein the bulk region is of a first conductivity type and contacts a first side of the thin gate insulator;
a gate electrode that contacts a second side of the thin gate insulator; and
a source region of a second conductivity type in the active layer of the semiconductor on insulator wafer, wherein the source region contacts the bulk region at a junction, wherein the junction forms a diode for the memory cell and the junction is laterally spaced from the thin gate insulator and does not directly underlie the thin gate insulator; and
wherein the gate electrode and the source region are operatively coupled to a programming voltage source that addresses the memory cell by blowing the thin gate insulator.

9. The memory cell of claim 8, wherein:
the thin gate insulator is less than 50 angstroms thick; and
the programming voltage source provides a programming voltage in excess of 10 volts to the polysilicon gate electrode and the source region.

10. The memory cell of claim 8, wherein:
the junction is at least 0.3 microns from the thin gate insulator.

11. The memory cell of claim 8, wherein:
the bulk region is not in contact with a drain region.

12. The memory cell of claim 8, wherein:
the bulk region has a first conductivity type;
the gate electrode is polysilicon of the first conductivity type; and
the source region has a second conductivity type.

13. The memory cell of claim 8, further comprising:
a layer of polysilicon comprising the gate electrode of the first conductivity type and a region of undoped polysilicon;
wherein the region of undoped polysilicon is in contact with the second side of the thin gate insulator and a masking layer; and
wherein the junction is also in contact with the masking layer.

14. An apparatus comprising:
an active layer having a first region located between one side of a thin gate insulator and a buried insulator of a semiconductor on insulator wafer;
a gate electrode in contact with a second side of the thin gate insulator;
a contact coupled to the active layer;
a program control line that causes a programming voltage to be applied across the gate electrode and the contact;
wherein the thin gate insulator breaks to form a current branch from the gate electrode through the first region to the contact when the programming voltage is applied; and
wherein a junction on the current branch forms a diode, and the junction is laterally spaced from the thin gate insulator and does not directly underlie the thin gate insulator;
the apparatus further comprising: a second region of the active layer having an opposite conductivity type to the first region; wherein the junction is defined by a common surface shared by the first region and the second region, and wherein the gate electrode comprises polysilicon that is doped to have the same conductivity type as the first region.

15. The apparatus of claim 14, wherein:
the gate electrode is undoped silicided polysilicon; and
the diode is a schottky diode.

16. The apparatus of claim 14, wherein:
the thin gate insulator is less than 40 angstroms thick and comprises silicon dioxide;
the programming voltage is greater than 9 volts; and
the junction is at least 0.5 microns from the thin gate insulator.

17. The apparatus of claim 14, wherein the gate electrode further comprises a region of undoped polysilicon; and
the region of undoped polysilicon is covered by a masking layer.

* * * * *